United States Patent
He et al.

(10) Patent No.: US 10,153,324 B2
(45) Date of Patent: Dec. 11, 2018

(54) LOW-VOLTAGE CHARGE-COUPLED DEVICES WITH A HETEROSTRUCTURE CHARGE-STORAGE WELL

(71) Applicant: ARIZONA BOARD OF REGENTS ON BEHALF OF ARIZONA STATE UNIVERSITY, Scottsdale, AZ (US)

(72) Inventors: Zhaoyu He, Santa Clara, CA (US); Yong-Hang Zhang, Scottsdale, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 15/679,003

(22) Filed: Aug. 16, 2017

(65) Prior Publication Data
US 2018/0069080 A1    Mar. 8, 2018

Related U.S. Application Data

(60) Provisional application No. 62/383,275, filed on Sep. 2, 2016.

(51) Int. Cl.
*H01L 27/148* (2006.01)
*H01L 29/15* (2006.01)
(Continued)

(52) U.S. Cl.
CPC ...... *H01L 27/148* (2013.01); *H01L 27/14806* (2013.01); *H01L 29/157* (2013.01); *H01L 29/205* (2013.01); *H01L 29/765* (2013.01)

(58) Field of Classification Search
CPC .......... H01L 29/157; H01L 27/148; H01L 27/14806; H01L 29/205; H01L 29/765
See application file for complete search history.

(56) References Cited

U.S. PATENT DOCUMENTS 5,258,641 A * 11/1993 Kida ..................... H01L 29/404
257/133
7,737,411 B2   6/2010 Gunapala et al.
(Continued)

OTHER PUBLICATIONS

W. S. Boyle et al., "Charge Coupled Semiconductor Devices," Bell Syst. Tech. Journal, 49, pp. 587-593 (1970).
(Continued)

*Primary Examiner* — Fei Fei Yeung Lopez
(74) *Attorney, Agent, or Firm* — Yakov S. Sidorin; Quarles & Brady LLP (57) ABSTRACT

A CCD with an internal heterostructure well to store the photogenerated carriers is realized by using barrier and absorber semiconductors with a type-II band alignment in nBn or pBp photodetectors to form a specific barrier configured to confine the depletion region and a well to trap and store the photogenerated minority carriers. Depending on the spectral regime, (InAs/InAsSb)/(InAs/AlGaSb) superlattices can be used in the infrared, Si/Ge or AlP/GaP in the visible portion of optical spectrum, and GaN/ZnO in the UV portion. The resulting device not only leverages the advantages of the conventional CCD (such as in-pixel signal integration to suppress the noise), but also boasts an advantageously low operational voltage, thereby ensuring the low power consumption and low band-to-band tunneling current/noise (in particular, for use as an infrared photodetector). In comparison with IR FPAs of related art, the cost of the device is reduced and no flip-chip mount on a read-out integrated circuit is required during the fabrication process.

12 Claims, 9 Drawing Sheets

(51) Int. Cl.
  *H01L 29/765* (2006.01)
  *H01L 29/205* (2006.01)

(56) References Cited

U.S. PATENT DOCUMENTS

| | | | | |
|---|---|---|---|---|
| 7,795,640 | B2 | 9/2010 | Klipstein | |
| 9,099,371 | B1* | 8/2015 | Crook | H01L 27/1463 |
| 9,231,137 | B1* | 1/2016 | Sharifi | H01L 31/11 |
| 2001/0043636 | A1* | 11/2001 | Bewley | B82Y 20/00 |
| | | | | 372/70 |
| 2005/0181187 | A1* | 8/2005 | Vosseler | B41C 1/10 |
| | | | | 428/195.1 |
| 2007/0235758 | A1* | 10/2007 | Klipstein | H01L 31/101 |
| | | | | 257/188 |
| 2010/0072514 | A1* | 3/2010 | Ting | H01L 31/0304 |
| | | | | 257/184 |
| 2012/0217478 | A1* | 8/2012 | Fujii | B82Y 20/00 |
| | | | | 257/21 |
| 2012/0280350 | A1* | 11/2012 | Smith | H01L 27/1446 |
| | | | | 257/448 |

OTHER PUBLICATIONS

P. Klipstein, "XBn Barrier Photodetectors for High Sensitivity and High Operating Temperature Infrared Sensor," Proc. of SPIE vol. 6940, 12 pp. (2008).

Y. F. Lao, et al., "Band Offsets and Carrier Dynamics of Type-II InAs/GaSb Superlattice Photodetectors Studied by Internal Photoemission Spectroscopy," Applied Physics Letters 103 (Published Online Oct. 30, 2013).

Z. Y. Lin et al., "Influence of Carrier Localization on Minority Carrier Lifetime in InAs/InAsSB Type-II Superlattices," Applied Physics Letters 107 (2015).

S. Maimon et al., "nBn Detector, an Infrared Detector With Reduced Dark Current and Higher Operating Temperature," Applied Physics Letters (Published Online Oct. 10, 2006).

X. M. Shen et al., "An Indirect Method of Studying Band Alignments in nBn Photodetectors Using Off-Axis Electron Holography," Applied Physics Letters 107 (Published Online Sep. 23, 2015).

R. D. Thom et al., "A Fully Monolithic InSb Infrared CCD Array," IEEE Transactions on Electron Devices, vol. ED-27, No. 1 (Jan. 1980).

M. V. Wadsworth et al., "Monolithic CCD Imagers in HgCdTe," IEEE Transactions on Electron Devices, vol. 42, No. 2 (Feb. 1995).

C. G. Van De Well et al., "Universal Alignment of Hydrogen Levels in Semiconductors, Insulators and Solutions," Nature Publishing Group (2003).

C. Y. Wei et al., "Technology Development for InSb Infrared Imagers," IEEE Transactions on Electron Devices, vol. ED-27, No. 1 (Jan. 1980).

M. V. Wadsworth et al., "Monolithic CCD Imagers in HgCdTe," IEEE Transactions on Electron Devices. vol. 2, No. 2 (Feb. 1995).

Y. H. Zhang, et al., "Effect of Hole-Localization Mechanisms on Photoluminescence Spectra of Two-Dimensional-Electron-Gas Systems," The American Physical Society, vol. 44, No. 3 (Jul. 1991).

* cited by examiner

LOW-VOLTAGE CHARGE-COUPLED DEVICES WITH A HETEROSTRUCTURE CHARGE-STORAGE WELL

CROSS-REFERENCE TO RELATED APPLICATIONS

This patent application claims benefit of and priority from the U.S. Provisional Patent Application No. 62/383,275 filed on Sep. 2, 2016, the disclosure of which is incorporated by reference herein.

STATEMENT REGARDING FEDERALLY SPONSORED RESEARCH OR DEVELOPMENT

This invention was made with government support under Grant Number W911NF-10-1-0524 awarded by the Army Research Office. The U.S. government has certain rights in the invention.

TECHNICAL FIELD

The present invention relates to charge coupled devices (CCDs) and, in particular, to CCDs focal plane arrays (FPAs) possessing low noise and low power consumption for use in photodetection and image sensing.

BACKGROUND

Figure 1:
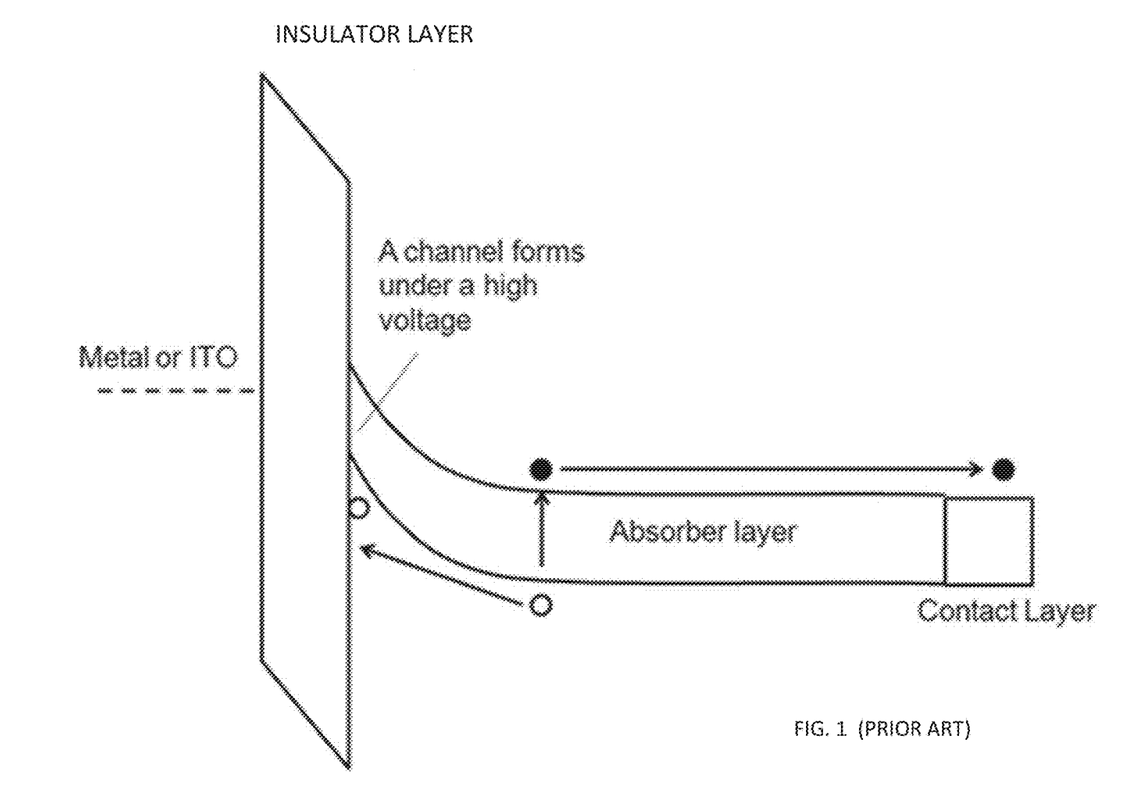
FIG. 1 is a MOS band diagram of a conventional CCD structure. Under high voltage, a channel forms at the insulator/absorber interface to store the photogenerated carriers. The band of the material bends severely and there can be high band-to-band tunneling current and high generation-recombination dark current.

A conventional MOS-based charge coupled device (CCD) (see, W. S. Boyle and G. E. Smith, Bell Syst. Tech. J. 49, 587, 1970) utilizes a MOS structure with a single semiconductor material—silicon, to absorb light, store the photogenerated charges, and read out the stored charges laterally. As is schematically illustrated in FIG. 1, a large external voltage is typically required to form a charge-storage channel at the semiconductor/oxide interface and to deplete the silicon deeply to enhance near-infrared (NIR) response. Such conventional CCD design, however, is not operationally effective when constructed with mid-wave and long-wave IR materials. Narrow-gap semiconductors have high band-to-band tunneling current and high generation-recombination (G-R) current under deep-depletion condition, which induce high noise and short charge storage time. In addition, a MOS capacitor using a narrow-gap semiconductor has a limited charge capacity because of its low background potential and charge trapping problem when shifting the charges laterally. (see, A. Rogalski, Progress in Quantum Electronics 36, 342-473, 2012) Although efforts have been made to develop monolithic FPAs using narrow-gap semiconductors such as HgCdTe and InSb, (see, M. V. Wadsworth, et. al. IEEE Transactions on Electron Devices 42, 2, 1995; and R. D. Thom, et. al. IEEE Transactions on Electron Devices ED-27, 1, 1980) silicon-based monolithic FPA technology appears to remain is the only mature technology with respect to fabrication yield and attainment of near-theoretical sensitivity. (see. A. Rogalski, Progress in Quantum Electronics 36, 342-473, 2012) In comparison with the commercial CMOS-based imaging technology, power consumption of the CCD is much higher, and a typical portable camera that utilizes a CCD imager has a much shorter battery lifetime than that utilizing a CMOS imager.

Developments to improve the process of fabrication and the operational advantages of the CCDs while maintaining the already-achieved features (such as, for example, noise suppression, high sensitivity, high fill factor) continue.

SUMMARY

A persisting problem of high power consumption of and high noise in CCDs configured for operation in the infrared portion of the optical spectrum has been solved by structuring an embodiment of the invention, possessing two layers of heterostructure semiconductors with a type-II bandgap alignment, to have such absorber layer the band of which is kept substantially flat during the operation of the device. The band bending or depletion is confined in the other said semiconductor layer with a larger band gap, which is referred to as charge-storage layer. Not only such solution unexpectedly minimizes the G-R dark current/noise and/or band-to-band tunneling current/noise in the absorber layer (which is especially advantageous for infrared materials with narrow bandgaps), it also substantially relaxes the requirement of the material quality and leads to the low operation voltage (which, in turn, lowers the power consumption during the device operation).

An embodiment of the present invention provides a CCD characterized by a near zero voltage (~0.1 V or less) required to collect the photogenerated carriers which does not induce the depletion of the absorber layer or significant interface carrier recombination, and/or to read out the collected carriers laterally. The CCD has a suppressed dark current/noise originated from the dark diffusion current in the absorber layer and the generation-recombination current in the charge-storage layer.

Preferably, an embodiment of the device is epitaxially grown using lattice-matched materials on epi-ready substrates. Related embodiments are configured to cover a broad wavelength range of operation from long-wave infrared to UV, with the use of various lattice-matched material systems with a type-II band alignment such as (InAs/InAsSb-superlattice)/(InAs/AlGaSb(As)-superlattice) and InAsSb/AlAsSb for infrared, GaSb/CdSe, AlSb/CdSe, and ZnTe/CdSe for near infrared or visible. GaP/AlP and GaN/ZnO for UV. A lattice-matched insulator layer is chosen depending on the lattice constant of the absorber layers, such as ZnTe for 6.1 Å, ZnSe for 5.5 Å, and AlN for 3.2 Å lattice constants, for example. In a related embodiment(s), the insulator layer can employ silicon oxide or aluminum oxide fabricated by atomic layer deposition after surface treatments for the charge-storage layer.

Embodiments of the invention also provide a semiconductor charged-coupled device (CCD) structure that includes first and second semiconductor heterostructure layers configured with a type II bandgap alignment between the first and second heterostructure layers, wherein an absorber layer of said structure has a band that remains substantially flat during an operation of said device. In a specific embodiment, such layered CCD structure contains a sequence of an upper electrically-conductive contact layer, a layer configured to operate as a neutral insulator layer, a layer configured as a charge-storage layer, the above-identified absorber layer, and a lower semiconductor contact layer (in which specific case the third layer is the first semiconductor heterostructure layer, and the absorber layer is the second semiconductor heterostructure layer). In a related embodiment, at least one of the following conditions is satisfied: a) the lower semiconductor contact layer and the absorber layer are made, respectively, from first and second materials, the first and second materials being substantially lattice-matched with one another; and b) the bandgap of the layer configured as a charge-storage layer is different from than that of the absorber layer. Alternatively or in addition, the bandgap of the layer that is configured as a charge-storage layer is greater from than that of the absorber layer.

Embodiments further provide a method for operating a semiconductor charged-coupled device (CCD) structure (the structure including a) first and second semiconductor heterostructure layers configured with a type II bandgap alignment between said first and second heterostructure layers, where the first semiconductor layer is a barrier layer; and the second semiconductor heterostructure layer is an absorber layer that has a band remaining substantially flat during an operation of said device; b) an upper electrically-conductive contact layer, c) a layer configured to operate as a neutral insulator layer, d) a layer configured as a charge-storage layer, and a lower semiconductor contact layer). The method includes accumulating photogenerated charges in the charge-storage layer by applying bias voltage between the upper electrically-conductive layer and the lower semiconductor contact layer while said lower semiconductor layer is grounded. In a particular embodiment of the method, the step of accumulating includes accumulating photogenerated electrons in said charge-storage layer by applying a positive bias voltage between the upper electrically-conductive contact layer and the lower semiconductor contact layer while said lower semiconductor contact layer is grounded. Alternatively or in addition, the step if accumulating may include accumulating photogenerated holes in the charge-storage layer by applying a negative bias voltage between the upper electrically-conductive contact layer and the lower semiconductor contact layer while said lower semiconductor contact layer is grounded.

BRIEF DESCRIPTION OF THE DRAWINGS

The invention will be more fully understood by referring to the following Detailed Description of Specific Embodiments in conjunction with the not-to scale Drawings, of which:

FIG. 2B is a band diagram of an embodiment of the MISS CCD that substantially "mirrors" that of FIG. 2A. When viewed from left to the right, the shown structure includes a metal (or, alternatively, ITO) contact, an insulator layer (oxide or large-gap semiconductor with a thickness of about 20 nm to 50 nm), a semiconductor charge-storage layer (an less than $10^{17}$ cm$^{-3}$ p-type with a thickness of about 100 nm), a semiconductor absorber layer (intrinsic or $<10^{16}$ cm$^{-3}$ p-type with a thickness of the penetration depth), a semiconductor contact layer ($>10^{18}$ cm$^{-3}$ p-type with a thickness of about 1 μm), and a metal Ohmic contact on the contact layer. The charge-storage layer has a bandgap that is greater than that of the absorber layer and has a type-II alignment with the absorber layer. The contact layer utilizes the same material as that of the absorber layer. A near-zero positive voltage bias is applied on the top contact to drive the photogenerated electrons into and to accumulate them in the charge-storage layer. The structure in FIG. 2B, where the semiconductor layer has p-type doing, is referred to as "p-MISS", for short.

FIG. 3 is a schematic diagram of a cross-section of an embodiment of the proposed MISS CCD device illustrating the lateral read-out of the present MISS CCD. Each pixel has its individual top contact on the top and all the pixels share one comment bottom contact. After the photogenerated charges are accumulated in the charge-storage layer, they are moved or read-out laterally along the charge-storage layer as a result of application of multi-phase clocking voltage to the top contacts.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

A conventional charge-coupled device (CCD), with which related art is well familiar, requires a high external voltage (external electrical bias) to be applied to the MOS structure to achieve a charge-storage well at the oxide/semiconductor interface of the device. The ever-increasing need in optimization of operational characteristics of CCD-based devices and, in particular, the need in reduction of external electrical bias required for the successful operation, as well as ever-pressing requirements of lower noise and lower power consumption beg a question of appropriate re-structuring the conventional CCD contraption.

In stark contradistinction with the related art, the present embodiments are configured to require substantially no external electrical bias to form such a charge-storage well. Embodiments of the present invention are realized around the idea that it is not necessary to utilize a single semiconductor material in the MOS structure to carry out the absorption of absorb light and storage of the electrical charges.

The advantage is realized, generally, by a judicious difference introduced to the conventional CCD structure, whereby the semiconductor structure in the CCD is enhanced with an internal two-layer heterostructure well with a type-II bandgap alignment configured to store the photogenerated carriers. As such, the present CCD structure employs two layers of heterostructure semiconductors, to absorb light and store charges respectively. These two layers, the absorber layer and the charge-storage layer, have a type-II bandgap alignment, and the charge-storage layer has a bandgap much larger than that of the absorber layer. An insulator layer is deposited on the charge-storage layer so that a heterostructure well is formed to store the photogenerated charges even though a zero voltage is applied onto the device. Such internal heterostructure drives one type of the photogenerated carriers into the well by diffusion, and separate the photogenerated electrons and holes. Such charge separation, achieved due to the type-II band alignment, ensures long charge storage time (see, for example, Y.-H. Zhang et. al. Phys. Rev. B44, Rapid Communications, 1399, 1991; and Y.-H. Zhang et. al. Phys. Rev. B44, Rapid Communications, 5958, 1991). By judiciously doping of the charge-storage layer, the present, novel CCD structure is formed to avoid band bending of the absorber layer and to confine the depletion region in the large-gap charge-storage layer. In one specific implementation, the device is realized by utilizing barrier and absorber semiconductors with a type-II band alignment in nBn or pBp photodetectors, to form a barrier to block the majority carriers, and a well to trap and store the photogenerated minority carriers.

As an advantageous result, the present CCD is especially effective to suppress the G-R or band-to-band tunneling current in infrared materials and it makes an infrared CCD with low noise possible. Moreover, embodiments of the disclosed CCD consume lower power than that required by a conventional CCD contraption (which, in practice, is easily translated to, for example, fabrication of portable CCD cameras with longer battery lifetime).

The disclosed CCD embodiments contain a sequence of a Metal contact-Insulator-Semiconductor charge-storage layer-Semiconductor absorber layer (or MISS, for short) layers. The charge-storage layer has a bandgap that is wider than and a type-II band alignment with the absorber layer. Proper ion implantation into the insulator layer may be required to get a near zero flat-band voltage for this MISS structure. When illuminated with light and under zero voltage, one type of the photogenerated carriers in the absorber layer falls into and gets accumulated in the charge-storage layer due to the formed type-II band alignment. The charge-storage layer is doped properly so that when reading out the charge signal laterally, the depletion is confined in the large-gap charge-storage layer. In advantageous comparison with structures of related art, the proposed configuration of the CCD ensures that the bands of the absorber layer is kept flat during the device operation, so that the generation-recombination and band-to-band tunneling noise is suppressed significantly, and the requirement of material quality is relaxed. The resulting low voltage operation ensures lower power consumption than the conventional CCDs.

Figure 2A:
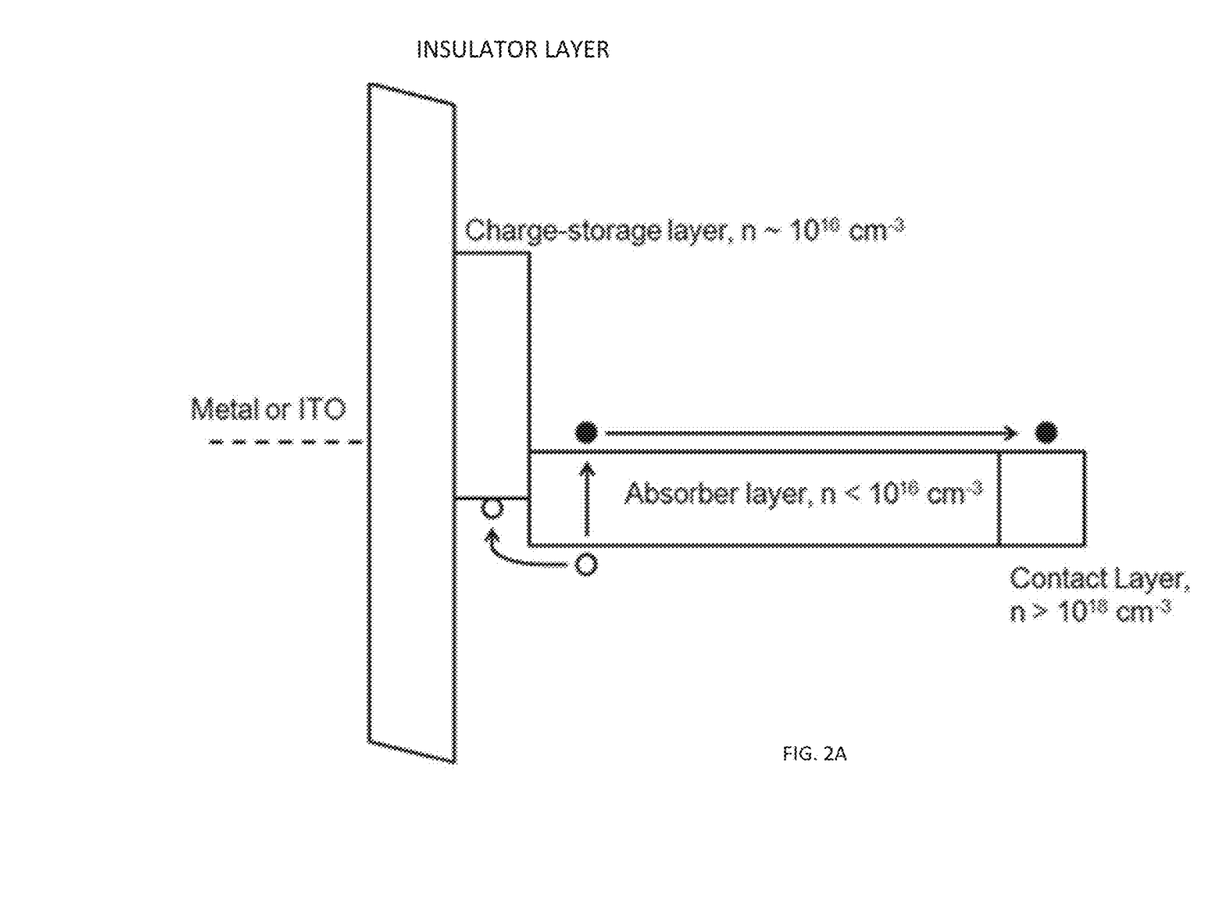
FIG. 2A is a band diagram of one embodiment of the present MISS CCD. Viewed from left to the right, it includes a metal (or ITO) contact, an insulator layer (oxide or large-gap semiconductor with a thickness of about 20 nm to 50 nm), a semiconductor charge-storage layer (generally less than $10^{17}$ cm$^{-3}$ n-type with a thickness of about 50 nm to 100 nm, in a specific case of about 100 nm), a semiconductor absorber layer (either intrinsic or $<10^{16}$ cm$^{-3}$ n-type with a thickness of about the optical penetration depth), a semiconductor contact layer ($>10^{18}$ cm$^{-3}$ n-type with a thickness of about 1 μm), and a metal Ohmic contact on the contact layer. The charge-storage layer has a bandgap that is greater than and has a type-II alignment with the absorber layer. The contact layer is made of the same material as that of the absorber layer. A near-zero negative voltage bias is applied on the top contact to drive the photogenerated holes into and accumulate them in the charge-storage layer. The structure in FIG. 2A, where the semiconductor layer has n-type doping, is referred to as "n-MISS", for short.
Figure 2B:
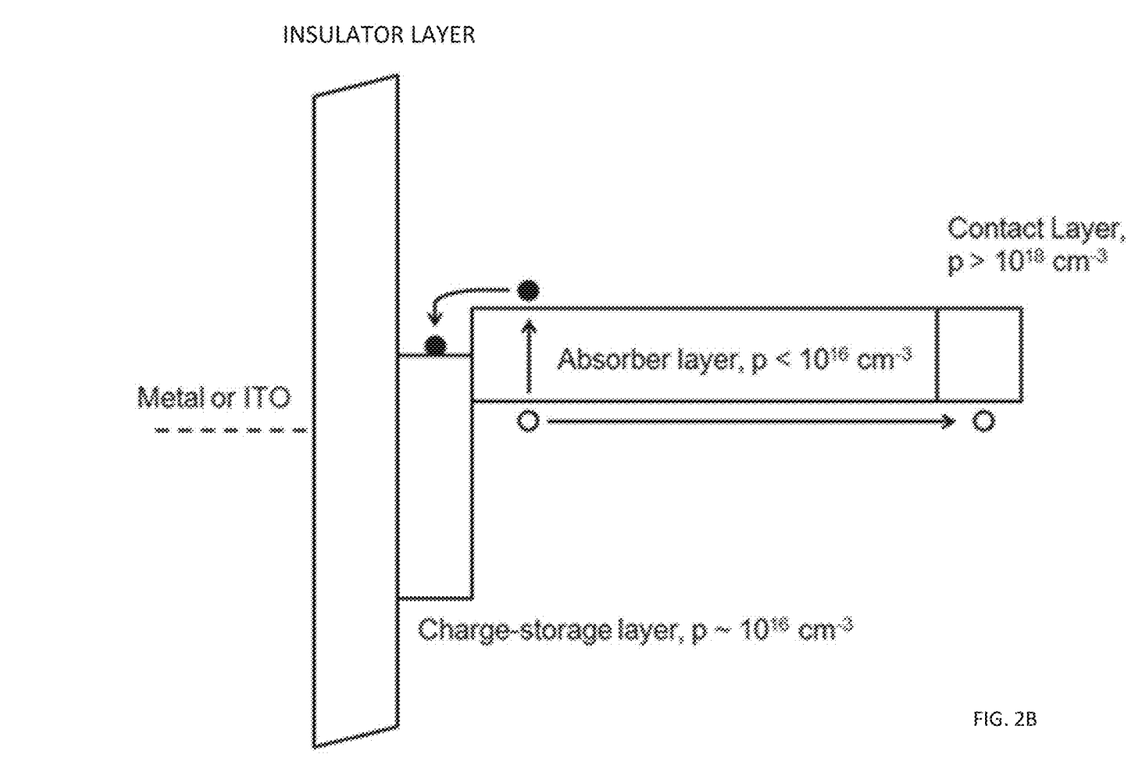

Examples of the proposed MISS structures are shown schematically in FIGS. 2A, 2B. To ensure a type-II band alignment of the charge-storage layer and the absorber layer, the valence band offset of these two layers is in the range from about 3 kT to {Eg(absorber)-3 kT}, where k is the Boltzmann constant, T is the temperature, and Eg(absorber) is the band gap of the absorber layer.

Depending on the specific kind of the type-II band alignment, the semiconductor layers are doped as n-type and p-type respectively. Regardless of the doping type, however, in this example the charge-storage layer is chosen to have a doping concentration of generally lower than $10^{17}$ cm$^{-3}$. The absorber layer has a doping concentration of <$10^{16}$ cm$^{-3}$, and the contact layer has a doping concentration of >$10^{18}$ cm$^{-3}$ to allow an Ohmic bottom contact to it. During the fabrication of the device, proper ion implantation into the insulator layer may be used to ensure very low flat-band voltage. The insulator layer has a thickness of about 20 nm to 50 nm, the charge storage layer has a thickness of about 100 nm, the absorber layer has a thickness equal to the optical penetration depth, and the contact layer has a thickness of about 1 μm.

Referring again to FIGS. 2A and 2B, the charge-storage layer has a band gap greater than that of the absorber layer and the charge-storage layer is doped with a generally lower than $10^{17}$ cm$^{-3}$ level of dopant concentration. The purpose of this design is to confine the depletion region in the charge-storage when applying the multi-phase clocking voltage pulses to read out the charge signal. Unlike depletion in the absorber layer, the depletion in the charge-storage layer does not induce high generation-recombination (G-R) dark current or band-to-band tunneling current because of the large band gap of the charge-storage layer.

In advantageous contradistinction with the conventional CCD (diagrammatically illustrated in FIG. 1), the band of the absorber layer of the embodiments of FIGS. 2A, 2B is always kept flat during the device operation. The flat band of the absorber ensures low G-R dark current, low band-to-band tunneling current, and therefore, low noise. Due to the type-II band alignment of the absorber layer and the charge-storage layer, very low external voltage is required to get the photogenerated carriers accumulated in the charge-storage layer and read out laterally. The low voltage operation ensures low power consumption. However, in the conventional CCD as shown in FIG. 1, a high external voltage is needed to form a charge-storage channel at the insulator/ semiconductor interface, and therefore the absorber bends severely. The severe band bending of the absorber induces high G-R dark current, high band-to-band tunneling current and thus high noise, especially for narrow-gap infrared materials or large-gap materials with high defect density. Also, the conventional CCD has higher power consumption.

Figure 3:
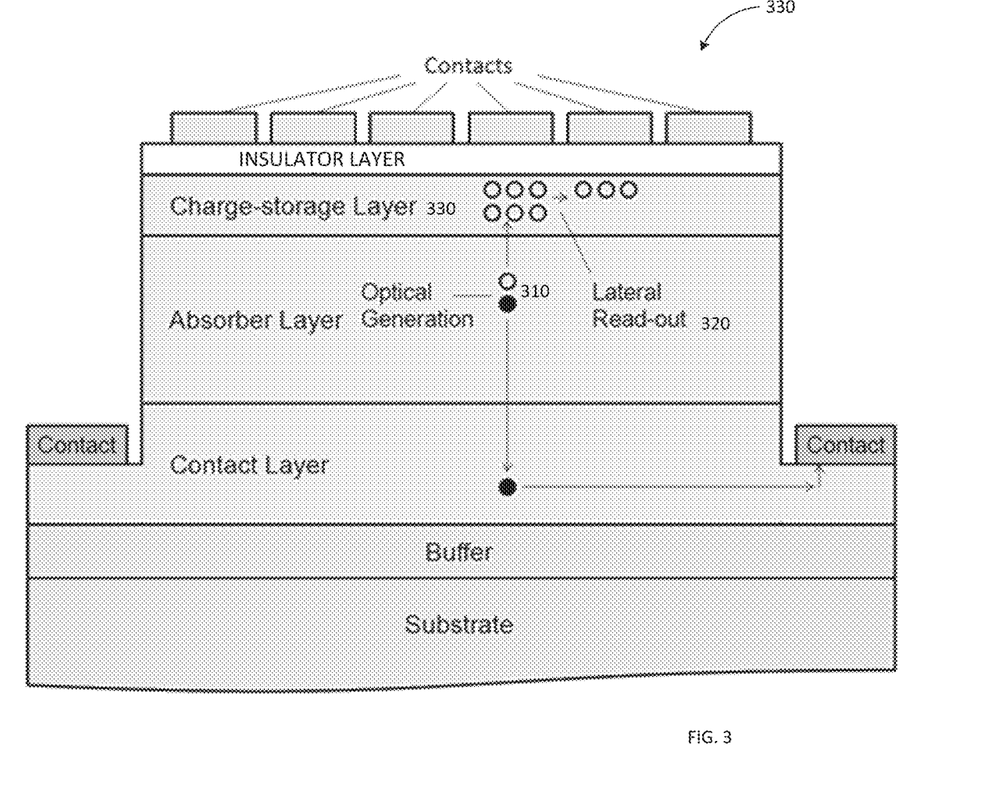

As illustrated schematically in FIG. 3, the reading-out method employed in operation of the embodiment of the present invention is substantially the same as that employed in the conventional CCDs, and requires multi-phase clocking voltage to transfer the accumulated photogenerated charges, 310, from one pixel to another laterally, 320, along the charge-storage layer. This lateral transferring process 320 continues until the charge signal is transferred to the output registers and amplifiers. The large bandgap and the doping of the charge-storage layer allow relatively high voltage operation for the reading out process, as long as the depletion region is kept in the charge-storage layer 330. The thicker and the higher the doping concentration of the charge-storage layer, the higher the voltage it is allowed to keep the depletion region in the charge-storage layer.

Figure 4:
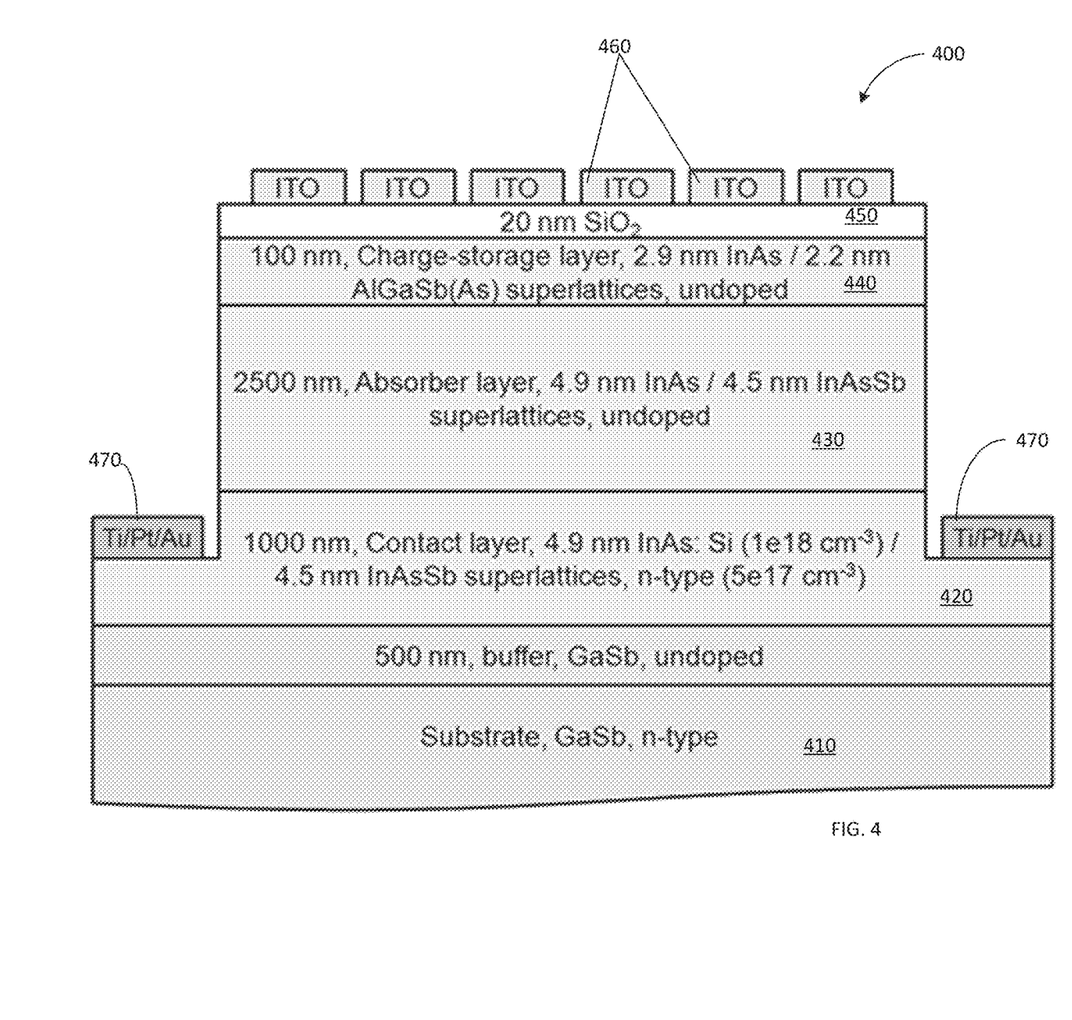
FIG. 4 depicts an embodiment of the proposed MISS CCD structure for use in IR photodetection, employing InAs/AlGaSb(As) superlattice as the charge-storage layer and InAs/InAsSb superlattice as the absorber layer.

FIG. 4 illustrates an embodiment 400 of the MISS CCD for infrared application. Here, the lattice matched InAs/InAsSb superlattice is used in the absorber layer and the InAs/AlGaSb(As) superlattice is used in the charge-storage layer. Mid-wave IR InAs/InAsSb superlattice with a period of 10 nm and a Sb composition of 0.19 has a reliably good material quality, which is revealed by a minority carrier lifetime of 12.8 μs measured by time resolved photoluminescence.

The structure of the embodiment of FIG. 4 includes:
a) An epi-ready GaSb substrate, 410;
b) An epitaxially grown lattice matched bottom contact layer 420, utilizing 4.9 nm InAs/4.5 nm $InAs_{0.81}Sb_{0.19}$ superlattice with high n-type doping concentration of $10^{18}$ cm$^{-3}$ of the Si dopant;
c) An epitaxially grown lattice matched undoped 4.9 nm InAs/4.5 nm $InAs_{0.81}Sb_{0.19}$ superlattice absorber layer with a bandgap of 0.25 eV and an unintentional background doping concentration of ~$10^{16}$ cm$^{-3}$, 430.
d) An epitaxially grown lattice matched undoped 2.9 nm InAs/2.2 nm $Al_{0.94}Ga_{0.06}Sb_{0.911}As_{0.089}$ superlattice charge-storage layer with a bandgap of 0.62 eV and a type-II bandgap alignment with the InAs/$InAs_{0.81}Sb_{0.19}$ absorber layer, 440. The doping concentration of the charge-storage layer is ~$3\times10^{16}$ cm$^{-3}$. The valence and conduction band offset between the charge-storage layer and the absorber layer are –0.08 eV and 0.45 eV respectively.
e) a 20 nm thick $SiO_2$ insulator layer grown by atomic layer deposition (ALD) after surface treatment using hydrogen plasma to minimize the oxygen and carbon defect density on the surface of the InAs/AlGaSb(As) superlattice charge-storage layer; 450.
f) a 70 nm thick ITO contacts, 460, defined by standard photo lithography and wet etch using HCl that etches ITO selectively and stops at the $SiO_2$ insulator layer. The ITO contacts allow front illumination.
g) a 50 nm Ti/50 nm Pt/300 nm Au metal layers, 470, deposited by e-beam or thermal evaporator as the bottom contact after etching which stops at the middle of the bottom contact layer. To etch the $SiO_2$, a solution of HF: $H_2O$=1 mL: 3 mL is used. To etch the InAs/AlGaSb(As) superlattice, a solution of phosphoric acid: hydrogen peroxide: water=1 mL: 1 mL: 10 mL is used.

To etch the InAs/$InAs_{0.81}Sb_{0.19}$ superlattice, citric acid (1 g powder: 1 mL water): hydrogen peroxide=50 mL: 1 mL is used.

One advantage of this embodiment includes a long carrier lifetime of the InAs/InAsSb superlattice up to 12.8 μs (see, Z.-Y. Lin, S. Liu, E. H. Steenbergen, Y.-H. Zhang, *Appl. Phys. Lett.* 107, 201107, 2015) and higher carrier mobility in the lateral direction than that of the vertical direction, which can ensure high lateral transferring efficiency.

Figure 5:
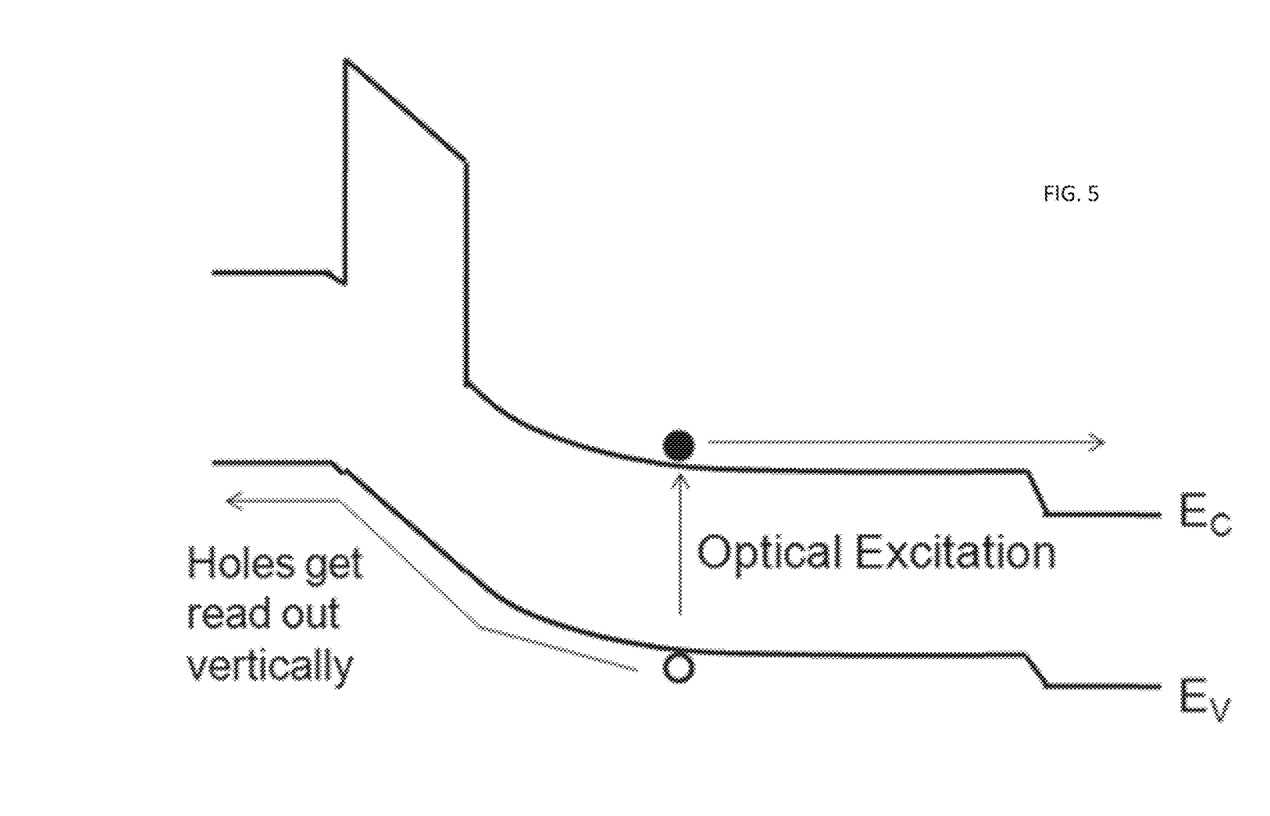
FIG. 5 is a band edge diagram of an nBn photodetector, in which the valence band is aligned and there is a barrier in the conduction band to block the n-type majority carriers. The photogenerated holes are extracted vertically to the contact through the valence band edge.

The charge-storage behavior due to the type-II bandgap alignment of the lattice matched InAs/InAsSb superlattice and the InAs/AlGaSb(As) superlattice can be observed in an nBn photodetector based on these two superlattices. An nBn photodetector configuration, illustrated in FIG. 5, can be utilized to suppress generation-recombination dark current in the absorber by confine the depletion region in a large-gap barrier layer. (see, P. Klipstein, *Proc. of SPIE Infrared Technology and Applications XXXIV,* 69402U, 2008) Such structure can considered as an n-type photoconductor with a heterostructure barrier possessing a large conduction band offset to block the majority carriers, and an aligned valence band edge to let the minority carriers pass freely. (see, P. C. Klipstein, U.S. Pat. No. 7,795,640, 2003; and S. Maimon and G. W. Wicks. *Appl. Phys. Lett.* 89, 151109, 2006)

Figure 6:
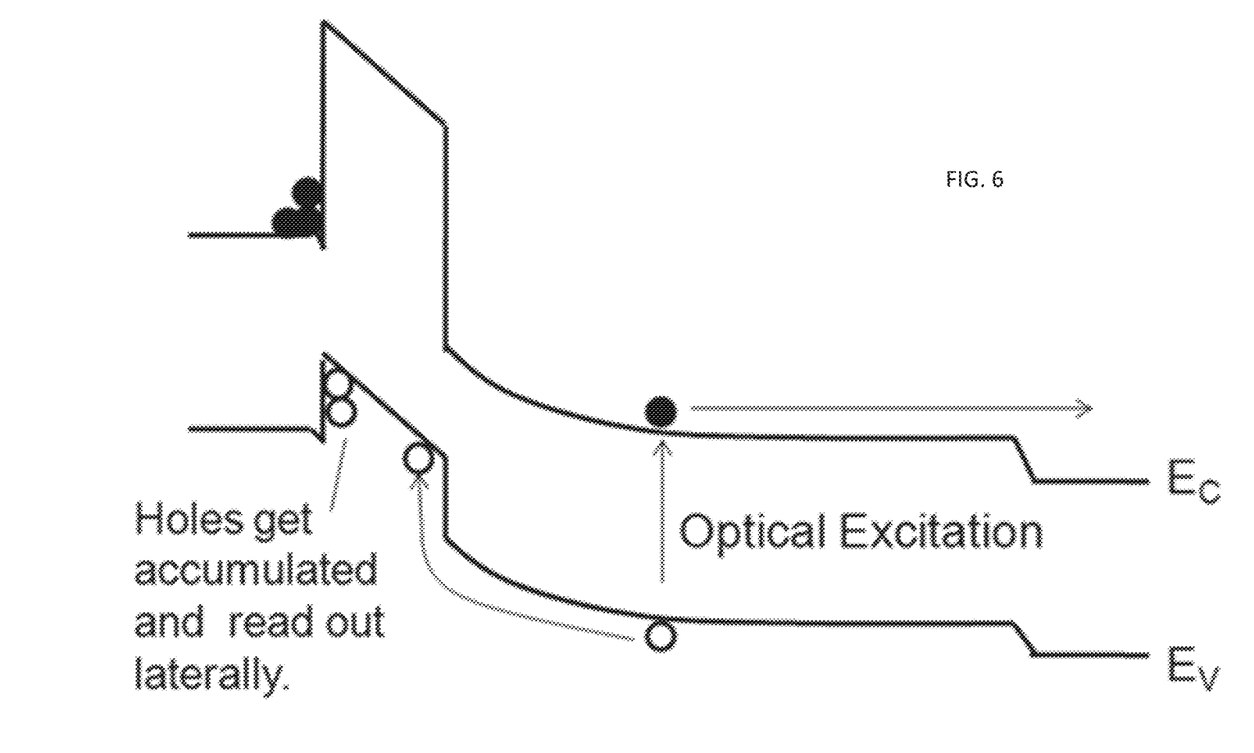
FIG. 6 presents a band edge diagram of an nBn photodetector in which, in comparison with that of FIG. 5, the valence band is not aligned and a well is formed in the valence band. The photogenerated holes diffuse into this well, get accumulated in this well, and get extracted or read out laterally along the barrier layer.

It would be appreciated by a skilled artisan that, instead of attempting to achieve the ideal nBn band alignment (as in FIG. 6), in an embodiment of the invention the barrier/absorber a type-II band alignment is intentionally made imperfect to achieve a heterostructure well configured to trap and store the photogenerated minority carriers, while, at the same time, configured to preserve the large heterostructure barrier to block the majority carriers. In a conventional nBn photodetector (in which signal is read out vertically to the top contact), the valence band edge well is believed to be detrimental to the device performance because the well makes the vertical read-out less efficient. (see, S. D. Gunapala et al. U.S. Pat. No. 7,737,411 B2, 2010) In an embodiment of the present invention, however, it is exactly this conventionally-viewed as being detrimental well is used for the operational benefit of the proposed structure for charge accumulation in the well and lateral read-out of the charges.

Figure 7:
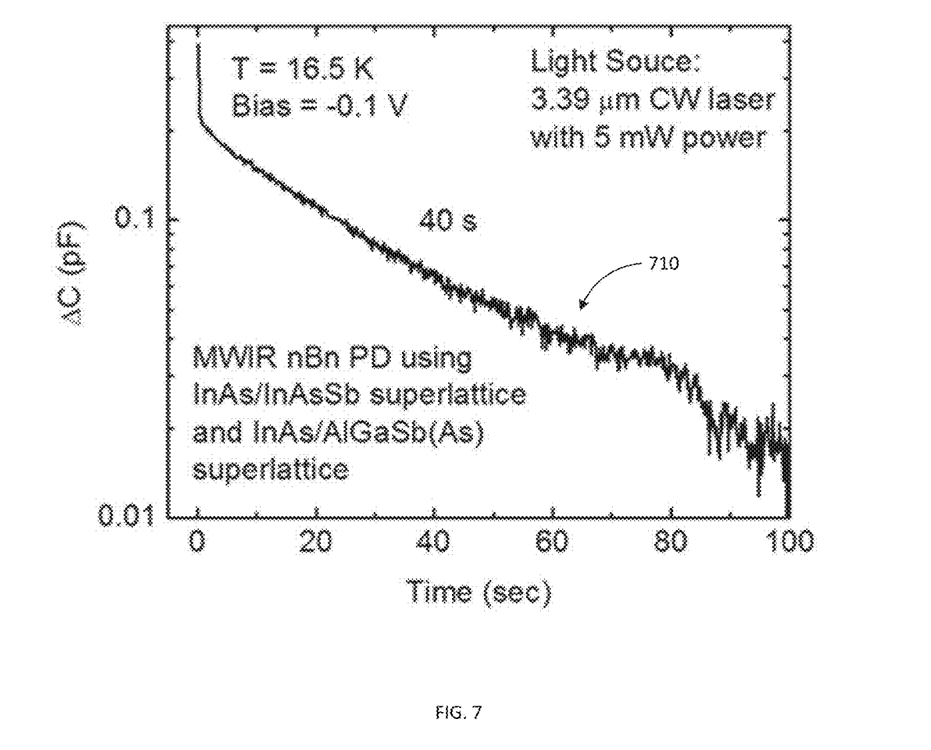
FIG. 7 illustrates the charge-storage behavior in an nBn photodetector with the band edge diagram of FIG. 6 based on an InAs/InAsSb superlattice absorber layer and an InAs/AlGaSb(As) superlattice barrier layer. At 14.5 K and a bias of −0.1 V, under a light illumination of 3392 nm CW laser, the capacitance of the device is enhanced by 0.2 pF, which suggests positive charges (holes) get stored in the barrier layer. After the light is turned off abruptly, the capacitance decays with a time constant of 40 s, indicating excellent interface quality and a storage time that is long enough for CCD applications. The long charge storage time of 40 s in the nBn photodetectors under a low voltage of −0.1 V indicates high transfer efficiency for the lateral reading-out in the CCDs using the InAs/InAsSb superlattice and the InAs/AlGaSb(As) superlattice.

As shown in FIG. 7, the charge storage in the barrier layer can be monitored by measuring the capacitance decay (curve 710) of the InAs/InAsSb superlattice nBn after the illumination light is turned off. At 14.5 K and a bias of –0.1 V, under a light illumination of 3392 nm CW laser with a power of ~1 mW, the capacitance of the device is enhanced by 0.2 pF, which suggests positive charges (holes) get stored in the barrier layer. After the light is turned off abruptly, the capacitance decays with a time constant of about 40 s, indicating excellent material/interface quality and a storage time that is long enough for CCD applications. The long charge storage time of about 40 s in the nBn photodetectors under a low voltage of –0.1 V indicates high transfer efficiency for the lateral reading-out in the CCDs using the InAs/InAsSb superlattice and the InAs/AlGaSb(As) superlattice.

The type-II bandgap alignment of the InAs/InAsSb superlattice and the InAs/AlGaSb(As) superlattice is revealed by an examination of the barrier layer in the nBn photodetector using off-axis electron holography. (see, X.-M. Shen, et al., *Appl. Phys. Lett.* 107, 122109, 2015) The room-temperature voltage profile of the cross-section shows the presence of positive charge with an estimated density of $1.81\times10^{17}$ cm$^{-3}$ in the barrier layer, (see, X.-M. Shen, et al., *Appl. Phys. Lett.* 107, 122109, 2015) which is due to the well in the valence band edge as a result of a type-II band alignment. At room temperature, the thermally generated intrinsic holes from the absorber layer fall into and get accumulated in the well of the valence band in the barrier layer. The high dark current, the I-V curve and the C-V curve of this nBn photodetector support the type-II band gap alignment of the InAs/InAsSb superlattice and the InAs/AlGaSb(As) superlattice. (see, X.-M. Shen, et al., *Appl. Phys. Lett.* 107, 122109, 2015)

Figure 8:
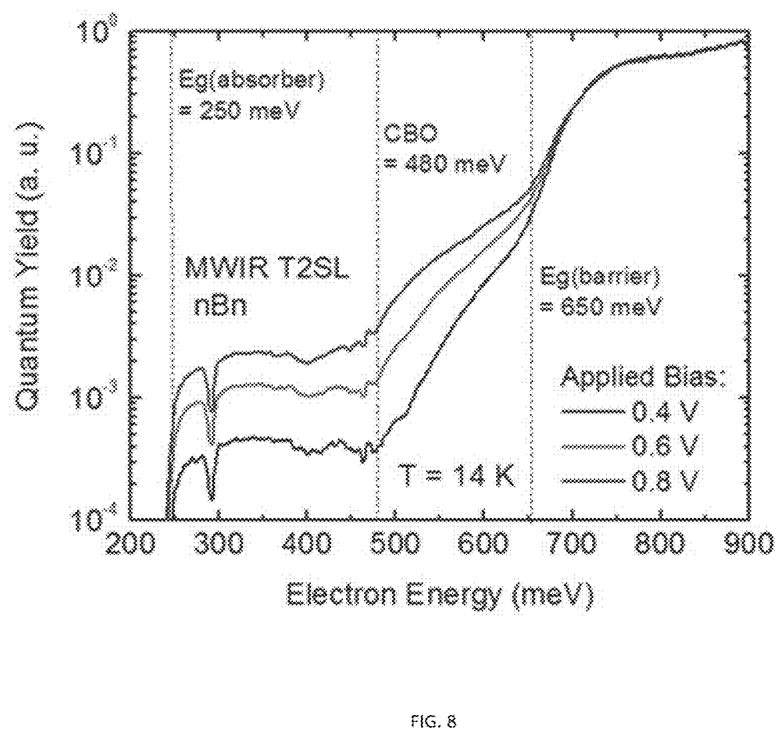
FIG. 8 is an illustration of the internal photoemission spectroscopy of the InAs/InAsSb-superlattice nBn photodetector under positive biases applied to the top contact. It is extracted from the quantum yield vs. photon energy curve that the barrier layer bandgap is 650 meV, the absorber layer bandgap is 250 nm, and the conduction band offset (CBO) is 480 meV. Accordingly, the valence band offset (VBO) can be estimated to be (650−250−480 meV)=−80 meV. The negative value of the VBO and the positive value of the conduction band offset (CBO) confirm that the InAs/InAsSb superlattice and the InAs/AlGaSb(As) superlattice have a type-II band alignment.

One can confirm the type-II bandgap alignment of the InAs/InAsSb superlattice and the InAs/AlGaSb(As) superlattice by measuring internal photoemission spectroscopy of the nBn photodetector under positive biases applied on the top contact. Similar determination of the band offset was used for a pBp photodetector using InAs/GaSb superlattice absorber and InAs/AlSb superlattice barrier layer. (see, Y.-F. Lao, et al., *Appl. Phys. Lett.* 103, 181110, 2013) From the quantum yield vs. photon energy curve, provided in FIG. 8, the band gap of the absorber layer, the band gap of the barrier layer, and the conduction band offset (CBO) between the absorber layer and the barrier layer can further be determined. Accordingly, the valence band offset (VBO) between the absorber layer and the barrier layer can be calculated to be about −80 meV, confirming that the absorber layer and the barrier layer have a strong type-II band gap alignment.

Alternatively or in addition, the confirmation of the type-II bandgap alignment of the InAs/InAsSb superlattice and the InAs/AlGaSb(As) superlattice can be carried out by measuring the luminescence of the nBn photodetector under voltage bias to detect possible photons with an energy corresponding to the type-II transition energy occurring at the interface between these two superlattices. In yet another related embodiment, such confirmation can be effectuated by measuring the photoluminescence of a sample with periodical structure of these two superlattices to detect possible photons with an energy corresponding to the type-II transition energy occurring at the interface between these two superlattices.

As long as two single crystal materials have a band alignment of type-II, it is possible to realize an embodiment of the present CCD using these two materials as the absorber layer and the charge-storage layer. To ensure better device performance, these two materials need to be lattice matched.

To ensure high lateral transferring efficiency, the defect density at the interface of the insulator layer and the charge-storage layer should be minimized. Therefore, most ideally, the insulator layer should have both a large bandgap and a lattice constant close to these two materials, so that the insulator layer can be grown epitaxially. More generally, regardless of the lattice constant, the insulator layer can be oxide such as silicon oxide and aluminum oxide by using atomic layer deposition after careful surface cleaning treatment for the charge-storage layer.

Generally, lattice-matched materials with a type-II band alignment that can be used in embodiments of the invention (see, C. G. Van de Walle and J. Neugebauer, Nature 423.626-628.2003) include but are not limited to:

Materials with a lattice constant near 6.1 Å, such as (InAs/InAsSb-superlattice)/(InAs/AlGaSb(As)-superlattice), InAsSb/AlAsSb, GaSb/CdSe, AlSb/CdSe, and CdSe/ZnTe. ZnTe can be used as a lattice matched insulator layer available for epitaxial growth.

Materials with a lattice constant near 5.5 Å, such as GaP/AlP. ZnS can be used as a lattice matched insulator layer available for epitaxial growth.

Materials with a lattice constant near 3.2 Å, such as GaN/ZnO. AlN can be used as a lattice matched insulator layer available for epitaxial growth.

Some characteristics of related embodiments of the present invention are summarized in Table 1.

TABLE 1

Embodiments of the invention utilizing lattice-matched semiconductor heterostructure with a type-II band alignment

| Detection wavelength | Absorber Layer | Charge-storage Layer | Insulator | Stored type of charge |
|---|---|---|---|---|
| LWIR or MWIR | InAs/InAsSb superlattice | InAs/AlGaSb(As) superlattice | $SiO_2$ or $Al_2O_3$ (Deposition) | Hole |
| LWIR or MWIR | InAs/InAsSb superlattice | InAs/AlGaSb(As) superlattice | ZnTe (epitaxial) | Hole |
| MWIR | $InAs_{1-x}Sb_x$ $0 < x < 0.2$ | $AlAs_{1-y}Sb_y$ $0.8 < y < 1$ | $SiO_2$ or $Al_2O_3$ (Deposition) | Hole |
| MWIR | $InAs_{1-x}Sb_x$ $0 < x < 0.2$ | $AlAs_{1-y}Sb_y$ $0.8 < y < 1$ | ZnTe (epitaxial) | Hole |
| MWIR | $InAs_{1-x}Sb_x$ $(0 < x < 0.2)$ | $Al_yGa_{1-y}Sb$ $(0.452-1.08x < y < 1.41-2.96x)$ | $SiO_2$ or $Al_2O_3$ (Deposition) | Hole |
| MWIR | $InAs_{1-x}Sb_x$ $(0 < x < 0.2)$ | $Al_yGa_{1-y}Sb$ $(0.452-1.08x < y < 1.41-2.96x)$ | ZnTe (epitaxial) | Hole |
| NIR | GaSb | CdSe | $SiO_2$ or $Al_2O_3$ (Deposition) | Electron |
| NIR | GaSb | CdSe | ZnTe (epitaxial) | Electron |
| Visible | AlSb | CdSe | $SiO_2$ or $Al_2O_3$ (Deposition) | Electron |
| Visible | AlSb | CdSe | ZnTe (epitaxial) | Electron |
| Red-blind Visible | ZnTe | CdSe | $SiO_2$ or $Al_2O_3$ (Deposition) | Electron |
| Visible | CdSe | ZnTe | $SiO_2$ or $Al_2O_3$ (Deposition) | Hole |
| UV | GaP | AlP | $SiO_2$ or $Al_2O_3$ (Deposition) | Hole |
| UV | GaP | AlP | ZnS (epitaxial) | Hole |
| UV | AlP | GaP | $SiO_2$ or $Al_2O_3$ (Deposition) | Electron |

TABLE 1-continued

Embodiments of the invention utilizing lattice-matched semiconductor heterostructure with a type-II band alignment

| Detection wavelength | Absorber Layer | Charge-storage Layer | Insulator | Stored type of charge |
|---|---|---|---|---|
| UV | AlP | GaP | ZnS (epitaxial) | Electron |
| UV | ZnO | GaN | SiO$_2$ or Al$_2$O$_3$ (Deposition) | Hole |
| UV | ZnO | GaN | AlN (epitaxial) | Hole |
| UV | GaN | ZnO | SiO$_2$ or Al$_2$O$_3$ (Deposition) | Electron |
| UV | GaN | ZnO | AlN (epitaxial) | Electron |

In accordance with described examples of embodiment, a solution is provided for the ever-existing need to lower the power consumption and costs associated with manufacture and operation of the IR CCDs while preserving the advantages of the conventional CCDs.

Some of the advantages of the proposed solution include material advantages, among which there are Excellent material quality ensured by epitaxial growth, such as lattice matched heterostructure interface and single crystal with low defect density.

Lattice matched insulator/semiconductor interface by using ZnTe as the insulator for compound semiconductors with a lattice constant near 6.1 Å (AlSb, GaSb, InAs, and CdSe).

Lattice matched insulator/semiconductor interface by using ZnS as the insulator for compound semiconductors with a lattice constant near 5.5 Å (GaP and AlP).

Lattice matched insulator/semiconductor interface by using AlN as the insulator for compound semiconductors with a lattice constant near 6.1 Å (GaN and ZnO).

Quality oxide/semiconductor interface ensured by atomic layer deposition after surface treatment for the semiconductor.

Tunable cut-off wavelength by changing the Sb composition and period of the InAs/InAsSb superlattice, or the Sb composition of the InAsSb alloy.

High lateral charge transferring efficiency due to the high lateral mobility of the superlattice material.

Additional advantages of the proposed solution over those of related art are further attributed to the utilized MISS structure, and include Suppressed band-to-band tunneling and G-R dark current/noise from the absorber layer with a flat band.

Low band-to-band tunneling and G-R dark current/noise from the charge-storage layer under charge-transferring clocking voltage by using charge-storage layer with large bandgap.

Lower requirement of the material quality because the absorber layer is depletion free.

Low operation voltage & power consumption and therefore long battery lifetime for portable devices.

In addition, the proposed solutions does not abandon but, instead, preserves the advantageous feature of the conventional CCD devices, such as in-pixel signal integration/averaging to suppress the noise; high sensitivity; high fill factor, the use of mature fabrication technology. Moreover, the fabrication of the embodiments of the proposed solution are characterized by low cost (as compared to the cost for current IR FPA) as such fabrication does not require the flip-chip mounting on a read-out IC.

To carry out the operation and/or design of the above-designed embodiments of the above-described IPM system (including the design of a multiplexed microfluidic chip, it may be required to employ a processor controlled by application-specific instructions stored in a tangible memory element. If such use of the processor is required, those skilled in the art should readily appreciate that required algorithmical functions, operations, and decisions may be implemented as computer program instructions, software, hardware, firmware or combinations thereof. Those skilled in the art should also readily appreciate that instructions or programs defining the functions and elements of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

The term "negative bias" as used herein means that and is defined as having the bias on the top contact is negative with the bottom contact on the bottom contact layer grounded. The term "positive bias" as used herein means that and is defined as having the bias on the top contact is positive with the bottom contact on the bottom contact layer grounded.

Within this specification, embodiments have been described in a way that enables a clear and concise specification to be written, but it is intended and will be appreciated that embodiments may be variously combined or separated without parting from the scope of the invention. In particular, it will be appreciated that each of the features described herein is applicable to most if not all aspects of the invention.

In addition, when the present disclosure describes features of the invention with reference to corresponding drawings (in which like numbers represent the same or similar elements, wherever possible), the depicted structural elements are generally not to scale, for purposes of emphasis and understanding. It is to be understood that no single drawing is intended to support a complete description of all features of the invention. In other words, a given drawing is generally descriptive of only some, and not necessarily all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this particular detail in the drawing may be implied unless the context of the description requires otherwise. The described single features, structures, or characteristics of the invention may be combined in any suitable manner in one or more further embodiments.

The invention as recited in claims appended to this disclosure is intended to be assessed in light of the disclosure as a whole, including features disclosed in prior art to which reference is made.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

While the invention is described through the above-described examples of embodiments, it will be understood by those of ordinary skill in the art that modifications to, and variations of, the illustrated embodiments may be made without departing from the inventive concepts disclosed herein. Disclosed aspects, or portions of these aspects, may be combined in ways not listed above. Accordingly, the invention should not be viewed as being limited to the disclosed embodiment(s).

The invention claimed is:

1. A semiconductor charged-coupled device (CCD) structure, comprising a sequence of:
an upper electrically-conductive contact layer,
a layer configured to operate as a neutral insulator layer,
a first semiconductor heterostructure layer configured as a charge storage layer,
an absorber layer, and
a lower semiconductor contact layer,
wherein said absorber layer is a second semiconductor heterostructure layer,
wherein said first and second semiconductor heterostructure layers are configured with a type II bandgap alignment between said first and second heterostructure layers,
wherein said absorber layer of said structure has a band that remains substantially flat during an operation of said device, and
wherein said insulator layer contains ions of materials defining said band.

2. A semiconductor CCD structure according to claim 1, wherein at least one of the following conditions is satisfied: a) the lower semiconductor contact layer and the absorber layer are made, respectively, from first and second materials, the first and second materials being substantially lattice-matched with one another; and b) the bandgap of the layer configured as a charge-storage layer is different from than that of the absorber layer.

3. A semiconductor CCD structure according to claim 1, wherein the bandgap of the layer is configured as a charge-storage layer is greater from than that of the absorber layer.

4. A semiconductor CCD structure according to claim 3, wherein a largest value of bias voltage that can be applied between the upper electrically-conductive layer and the lower semiconductor contact layer to avoid depletion of the absorber layer is equal to $$\frac{q d_s N_d}{\varepsilon_0}\left(\frac{d_s}{2\varepsilon_s} + \frac{d_i}{\varepsilon_i}\right),$$

where q is an elementary charge, $N_d$ is a doping concentration of the charge-storage layer, $\varepsilon_0$ is a vacuum permittivity, $d_s$ is a thickness of the charge-storage layer, $\varepsilon_s$ is a dielectric constant of the charge-storage layer, $d_i$ is a thickness of the neutral insulator layer, $\varepsilon_i$ is a dielectric constant of the insulator layer.

5. A semiconductor CCD structure according to claim 3, configured to congregate photogenerated holes in the charge-storage layer in response to application of negative bias voltage between said upper electrically-conductive contact layer and said lower semiconductor contact layer while said lower semiconductor contact layer is grounded.

6. A semiconductor CCD structure according to claim 1, wherein
said layer is configured as a charge-storage layer has an n-type doping with concentration of less than $10^{17}$ cm$^{-3}$ and a thickness about 100 nm;
said absorber layer has an n-type doping with concentration of less than $10^{16}$ cm$^{-3}$ and a thickness substantially equal to a depth of optical penetration therein; and
said lower semiconductor contact layer has an n-type doping with concentration greater than $10^{18}$ cm$^{-3}$ and a thickness of about 1 μm.

7. A semiconductor CCD structure according to claim 6, configured to congregate photogenerated electrons into said charge-storage layer in response to a positive bias voltage applied between said upper electrically-conductive contact layer and said lower semiconductor contact layer while said lower semiconductor contact layer is grounded.

8. A semiconductor CCD structure according to claim 1, wherein
said layer is configured as a charge-storage layer has a p-type doping with concentration of less than $10^{17}$ cm$^{-3}$ and a thickness about 100 nm;
said absorber layer has a p-type doping with concentration of less than $10^{16}$ cm$^{-3}$ and a thickness substantially equal to a depth of optical penetration therein; and
said lower semiconductor contact layer has a p-type doping with concentration greater than $10^{18}$ cm$^3$ and a thickness of about 1 μm.

9. A semiconductor CCD structure according to claim 1, wherein a material system formed by said absorber-layer and charge-storage-layer is a lattice-matched material system comprising one of (InAs/InAsSb-superlattice)/(InAs/AlGaSb(As)-superlattice), InAsSb/AlAsSb, InAsSb/AlGaSb, GaSb/CdSe, AlSb/CdSe, ZnTe/CdSe, CdSe/ZnTe, GaP/AlP, AlP/GaP, ZnO/GaN, and GaN/ZnO.

10. A semiconductor CCD structure according to claim 1, wherein the insulator layer comprises (i) one of SiO$_2$ or ZnTe if the charge-storage layer has a lattice constant of about 6.1 Å, (ii) ZnS if the said charge-storage layer has a lattice constant of about 5.5 Å, and (iii) AlN if the charge-storage layer has a lattice constant of about 3.2 Å.

11. A semiconductor CCD structure according to claim 1, wherein a thickness of the absorber layer is substantially equal to a depth of optical penetration into said absorber layer.

12. A semiconductor CCD structure according to claim 1, having a valence band offset between the first and second semiconductor heterostructure layers is in the range from 3 kT to [Eg,absorber−3 kT], wherein k is the Boltzmann constant, T is the temperature, and Eg,absorber is a band gap of the absorber layer.

* * * * *